United States Patent
Walton et al.

(10) Patent No.: US 6,801,149 B2
(45) Date of Patent: Oct. 5, 2004

(54) DIGITAL/ANALOG CONVERTER, DISPLAY DRIVER AND DISPLAY

(75) Inventors: Harry Garth Walton, Oxford (GB); Mike James Brownlow, Abingdon (GB); Graham Andrew Cairns, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/425,024

(22) Filed: Apr. 28, 2003

(65) Prior Publication Data

US 2004/0004566 A1 Jan. 8, 2004

(30) Foreign Application Priority Data

May 17, 2002  (GB) .............................................. 0211325

(51) Int. Cl.[7] .............................................. H03M 1/66
(52) U.S. Cl. ...................................... 341/150; 341/153
(58) Field of Search ................................ 341/150, 144, 341/153, 18, 118; 345/91, 90, 87

(56) References Cited

U.S. PATENT DOCUMENTS

| | | | | |
|---|---|---|---|---|
| 5,764,216 A | * | 6/1998 | Tanaka et al. | 345/87 |
| 5,796,384 A | * | 8/1998 | Kim | 345/87 |
| 5,889,486 A | * | 3/1999 | Opris et al. | 341/150 |
| 6,154,121 A | * | 11/2000 | Cairns et al. | 341/138 |
| 6,600,472 B1 | * | 7/2003 | Nakai et al. | 345/91 |

* cited by examiner

Primary Examiner—Peguy JeanPierre
(74) Attorney, Agent, or Firm—Renner, Otto, Boisselle & Sklar, LLP

(57) ABSTRACT

A switched capacitor digital/analog converter is provided for performing non-linear conversion. An input receives an n bit digital word for conversion. The individual bits of the input word control electronic switches which switch the plates of n capacitors between upper and lower reference voltages. The capacitors have values $C_0, \ldots C_{n-1}$ such that $C_x < C_{x+1}$ for each integer x greater than $-1$ and less than $(n-1)$ and such that $C_{y+1}$ is different from $2 \cdot C_y$ for at least one integer y greater than $-1$ and less than $(n-1)$. The other electrodes of the capacitors are connected together and to the output of the converter.

20 Claims, 7 Drawing Sheets

Conventional Art

DIGITAL/ANALOG CONVERTER, DISPLAY DRIVER AND DISPLAY

BACKGROUND OF THE INVENTION

1. Field of the Invention

The present invention relates to a switched capacitor digital/analog converter, to a display driver including such a converter, and to a display including such a driver. Such a converter may be used to provide gamma correction, for example, in liquid crystal displays.

2. Description of the Related Art

FIG. 1 of the accompanying drawings illustrates a typical example of a known type of active matrix liquid crystal display (LCD) 1. The display comprises an active matrix of picture elements (pixels) arranged as rows and columns. The display 1 is connected to a "host" 3, such as a personal computer graphics card, for supplying image data to the display via a connection 23, such as a ribbon cable. The display comprises a digital/analog converter (DAC) 5, which receives an n bit digital word G(0:n−1) and converts this to the corresponding analog voltage. The voltage is supplied to a column electrode 7 by a column controller 9 controlled by a timing and logic circuit 21.

The timing and logic circuit 21 also controls a row controller 11, which supplies row select signals in turn to row electrodes such as 15 of the display. An example of one of the pixels of the matrix is shown in detail in FIG. 1 and comprises a thin film transistor (TFT) 13, whose gate is connected to the row electrode 15 and whose source is connected to the column electrode 7. The drain of the transistor 13 is connected to a liquid crystal pixel 17, which is illustrated as and may be considered electrically as a capacitor, and to an optional additional storage capacitor 19.

As is well known, liquid crystal pixels do not respond linearly to drive voltage amplitude. For example, FIG. 2 of the accompanying drawing illustrates a typical example of the relationship between the brightness of a liquid crystal pixel and the voltage applied to the pixel. Digital/analog converters convert the input digital word into the appropriate one of a plurality of evenly spaced voltages and eight such voltages V0, . . . , V7 corresponding to a three bit word are illustrated in FIG. 2 together with the corresponding brightnesses T0, . . . , T7. The response to evenly spaced applied voltages is highly non-linear. For example, the change in brightness from T0 to T1 when the applied voltage changes from V0 to V1 is much smaller than the change in brightness from T2 to T3 when the applied voltage changes from V2 to V3. The image data are such that equal changes in applied voltage are intended to produce equal changes in brightness and, in order to take account of the non-linear response of liquid crystal pixels, a type of correction known as "gamma correction" has to be performed.

U.S. Pat. No. 6,154,121 discloses a digital/analog converter which provides gamma correction for liquid crystal displays. This is based on a standard type of converter having a linear transfer characteristic together with means for selecting the reference voltages supplied to the converter from a plurality of non-uniformly spaced reference voltages. This technique is based on dividing the non-linear brightness/applied voltage characteristic into a plurality of sub-sections lying between the non-uniformly spaced reference voltages and effectively approximates the curve with a plurality of line segments so as to achieve more evenly spaced brightness levels for evenly spaced inputs. However, this technique requires the generation of the non-uniformly spaced reference voltages. Also, if the converter is not formed or mounted directly on the display substrate, external wires carrying analog voltages must be provided between the converter and the display.

U.S. Pat. No. 5,764,216 discloses a technique for providing gamma correction in the digital domain using a digital memory. When a digital word requesting a specific grey level is supplied, this is converted to the corresponding analog voltage but the digital word is also used to interrogate the memory, which supplies one or more correction bits. The correction bits are used to calculate a correction to the analog voltage supplied by the linear converter. The memory must have sufficient capacity to contain the number of possible grey levels multiplied by the number of correcting bits at each memory address. Also, it is necessary to process additional digital signals during the conversion i.e. n+m bits are required to obtain $2^n$ distinct grey levels, where m is the number of bits supplied by the memory.

U.S. Pat. No. 5,796,384 discloses the combination of a digital/analog converter and a memory. This document refers to gamma correction but does not disclose how such correction is performed.

U.S. Pat. No. 5,889,486 discloses an example of a binary weighted switched capacitor digital/analog converter. Converters of this type are based on a set of capacitors whose values are in the ratio of 2:1 and have a linear transfer characteristic in that the analog output voltage is a linear function of the digital input supplied to the converter.

SUMMARY OF THE INVENTION

According to a first aspect of the invention, there is provided a switched capacitor digital/analog converter comprising an input for an n bit digital word, where n is an integer greater than two, and n capacitors having values $C_0, \ldots, C_{n-1}$ such that $C_x < C_{x+1}$ for each integer x greater than −1 and less than (n−1), the capacitors having first electrodes which are connected together, each of the capacitors having a second electrode which is connectable to a first or second reference voltage in accordance with the value of a respective one of the bits of n bit word, characterised in that $C_{y+1}$ is different from $2 \cdot C_y$ for at least one integer y greater than −1 and less than (n−1).

$C_{p+1}/C_p$ may be different from $C_{q+1}/C_q$ for at least one integer p greater than −1 and less than (n−1) and at least one integer q different from p and greater than −1 and less than (n−1).

The converter may comprise a terminating capacitor having a first electrode connected to the first electrodes of the n capacitors and a second electrode for receiving the first reference voltage. As an alternative, the converter may comprise a terminating capacitor constituted by parasitic capacitance.

The converter may comprise means for selectively discharging all of the capacitors.

The second electrode of each capacitor of value $C_r$ may be connectable to the first or second reference voltage in accordance with the value of the rth significant bit of the n bit word for each integer r greater than −1 and less than n.

$C_s$ may be equal to $A_s \cdot C_0$ for each integer s greater than zero and less than n, where each $A_s$ is an integer greater than zero.

The converter may comprise an output arranged to be switched to at least one further reference voltage in response to at least one predetermined digital word for conversion. The at least one further reference voltage may comprise the first or second reference voltage.

The converter may comprise a circuit for receiving an m bit word for conversion and for supplying to the input the n bit word derived from the m bit word in accordance with a predetermined function, where m is an integer greater than one. For example, m may be equal to n or may be less than n. During a conversion phase, the voltage at the first electrodes may be a non-monotonic function of the n bit digital word and the predetermined function may be such that the voltage at the first electrodes is a monotonic function of the m bit word. The circuit may comprise a combinatorial logic circuit, a memory containing a look-up table, or both.

According to a second aspect of the invention, there is provided a display driver comprising at least one converter according to the first aspect of the invention.

According to a third aspect of the invention, there is provided a display comprising a driver according to the second aspect of the invention.

The at least one converter may be arranged to provide gamma correction.

The display may comprise a liquid crystal display.

The first electrodes of the capacitors of the or each converter maybe connected directly without buffering to a pixel matrix of the display.

It is thus possible to provide a switched capacitor digital/analog converter of substantially conventional construction but with capacitor values which are such that a non-linear conversion transfer function can be provided. Such an arrangement has many applications, including providing gamma correction in displays. A relatively simple gamma correction technique can be performed and does not require excess bits to be processed or additional reference voltages to be generated.

DESCRIPTION OF THE PREFERRED EMBODIMENTS

Figure 3:
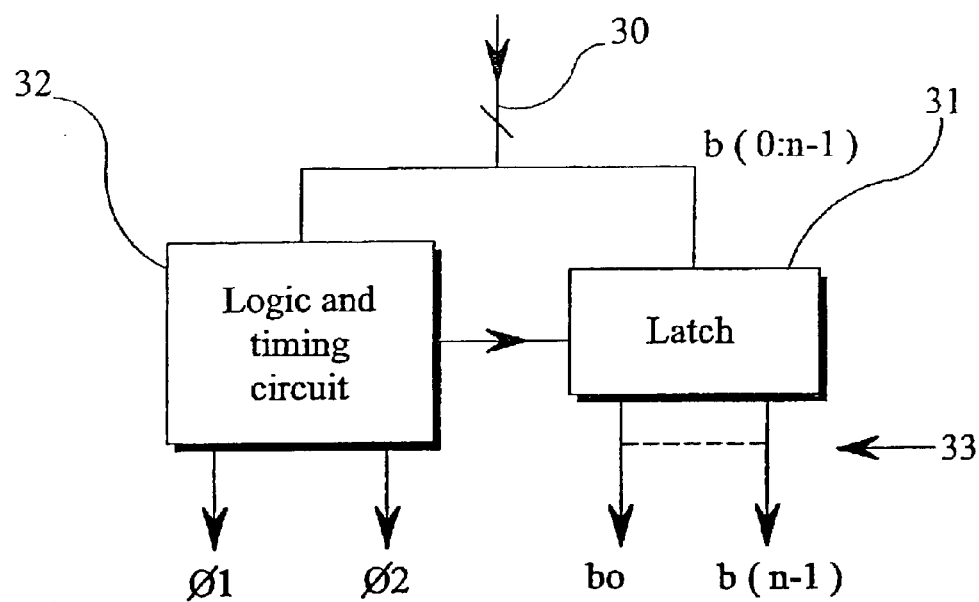
FIG. 3 is a circuit diagram illustrating a switched capacitor digital/analog converter constituting an embodiment of the invention.

The switched capacitor digital/analog converter shown in FIG. 3 has an input 30 connected to a latch 31 and a logic and timing circuit 32. The circuit 32 supplies two phase non-overlapping clock signals $\phi 1$ and $\phi 2$ and controls the operation of the converter. The latch 31 receives and stores, under control of the circuit 32, an n bit binary word b(0;n−1) and supplies the individual bits b0 . . . , b(n−1) at parallel outputs 33.

The converter comprises an output 34 which supplies an analog voltage $V_{out}$ as the result of each digital/analog conversion. The output 34 is connected to the first electrodes or plates of capacitors $35_0, 35_1, \ldots, 35_{n-1}$ and to the first plate of a terminating capacitor 36. A first reference voltage V1 is supplied to the second plate of the capacitor 36 and to the first input terminals of electronic changeover switches $37_0, 37_1, \ldots, 37_{n-1}$, whose second input terminals are connected to receive a second reference voltage V2 and whose outputs are connected to the second plates of the capacitors $35_0, 35_1, \ldots, 35_{n-1}$, respectively. A switch 38 is arranged to connect the output terminal 34 to the first reference voltage V1 in response to the first clock signals $\phi 1$.

The switches $37_0, 37_1, \ldots, 37_{n-1}$ are controlled by the second clock signals $\phi 2$ and by the values of the individual bits bo, . . . , b(n−1) of the input word. In particular, during the conversion phase, each switch connects the second plate of the associated capacitor to the second reference voltage V2 if the corresponding bit of the digital word has the value 1 when the second clock signal $\phi 2$ is active and otherwise connects the second plate to the first reference voltage V1.

The capacitance of the terminating capacitor 36 may be equal to or different from the capacitance of the lowest value capacitor $35_0$, which is controlled by the least significant bit b0 of the input digital word to the converter. The capacitances of the capacitors increase in value from the capacitor $35_0$ to the capacitor $35_{n-1}$.

During each conversion operation for each digital word supplied to the input 30, the clock signal $\phi 1$ is initially produced by the circuit 32 so that the switch 38 is closed and the switches $37_0, \ldots, 37_{-1}$ connect the second plates of the capacitors $35_0, \ldots, 35_{n-1}$ to the first reference voltage V1. All of the capacitors are therefore discharged prior to the conversion phase. During the conversion phase, the clock signal $\phi 1$ is inactive so that the switch 38 is opened. The clock signal $\phi 2$ becomes active and the switches $37_0, \ldots, 37_{n}-1$ are controlled in accordance with the individual bits of the input word such that the second plate of each capacitor whose corresponding bit is at level 1 is switched to the second reference voltage V2. The output signal $V_{out}$ at the output 34 of the converter is then given by:

$$V_{out} = V1 + (V2 - V1)(B_0 \cdot C_0 + B_1 \cdot C_1 + \ldots + B_{n-1} \cdot C_{n-1})/$$
$$(C_0 + C_1 + \ldots + C_{n-1} + C_{term})$$

where $C_{term}$ is the capacitance of the terminating capacitor 36 and $C_0, \ldots, C_{n-1}$ are the capacitances of the capacitors $35_0, \ldots, 35_{n-1}$, respectively.

The capacitances are such that a common ratio between consecutive values does not exist for all of the capacitors. In particular, at least two pairs of capacitors satisfy the following relationship:

$$C_{p-1}/C_p \neq C_{q+1}/C_q$$

where $p \neq q$ and each of p and q is greater than −1 and less than (n−1).

By way of example, for a three bit input word (i.e. n=3) with $C_{term}$=0.1 pF, $C_0$=0.3 pF, $C_1$=0.5 pF, $C_2$=0.7 pF, V1=0 and V2=1 volt, the converter has a non-linear conversion function as shown in the following table:

TABLE I

| Input Word b (0:2) | Out Voltage $V_{out}$ |
|---|---|
| 000 | 0 |
| 001 | 3/16 |
| 010 | 5/16 |
| 011 | 8/16 |
| 100 | 7/16 |
| 101 | 10/16 |
| 110 | 12/16 |
| 111 | 15/16 |

The spacing or interval between consecutive output voltage values is non-uniform so that the conversion operation is non-linear. Also, the output voltages are non-monotonic in that, for increasing values of the input word, the output voltage first increases, then decreases from 8/16 volts to 7/16 volts when the input word increases from 011 to 100, and then increases again.

Figure 4:
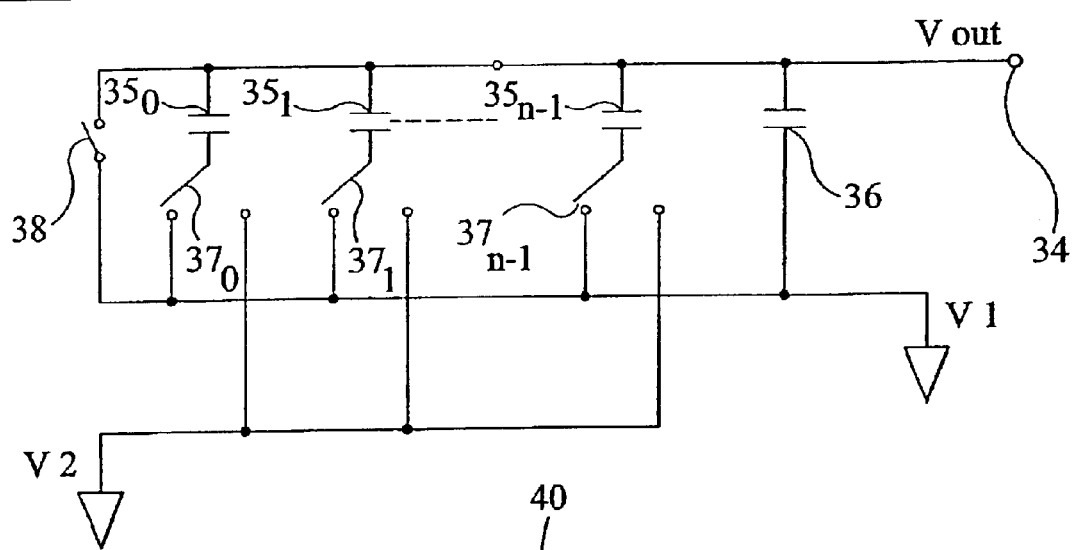
FIG. 4 is a block diagram illustrating a converter of the type shown in FIG. 2 together with a look-up table.
Figure 4:
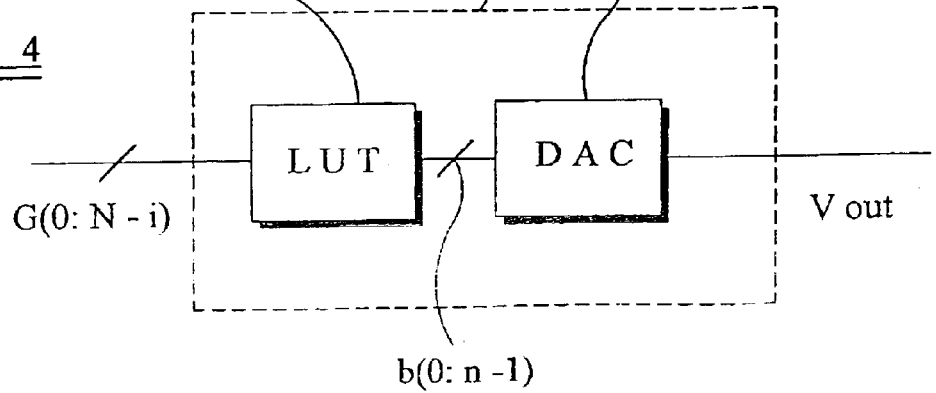

FIG. 4 illustrates a converter arrangement 40 comprising a digital/analog converter (DAC) of the type shown in FIG. 3 and a function generating circuit 42 in the form of a lock-up table stored in a memory. The circuit 42 has memory address inputs forming the input of the arrangement 40 and receiving an input digital word G(0:n−1) for conversion. The outputs of the memory supply the digital word b(0:m−1) to the converter 41. The look-up table 42 represents a function which, together with the conversion function of the converter 41, supplies a monotonically increasing output voltage $V_{out}$ for monotonically increasing values of the digital word G(0:m−1). Table II illustrates this for a specific example where n=3, m=3, and the capacitances and voltages are the same as in the previously described specific example.

TABLE II

| Input Word G (0:2) | Output Word b (0:2) | Vout |
|---|---|---|
| 000 | 000 | 0 |
| 001 | 001 | 3/16 |
| 010 | 010 | 5/16 |
| 011 | 100 | 7/16 |
| 100 | 011 | 8/16 |
| 101 | 101 | 10/16 |
| 110 | 110 | 12/16 |
| 111 | 111 | 15/16 |

In this particular example, the mapping contained in the look-up table 42 effectively reverses the order of the input words 011 and 100 so that the arrangement 40 provides monotonic conversion with non-uniformly spaced output voltages.

Figure 1:
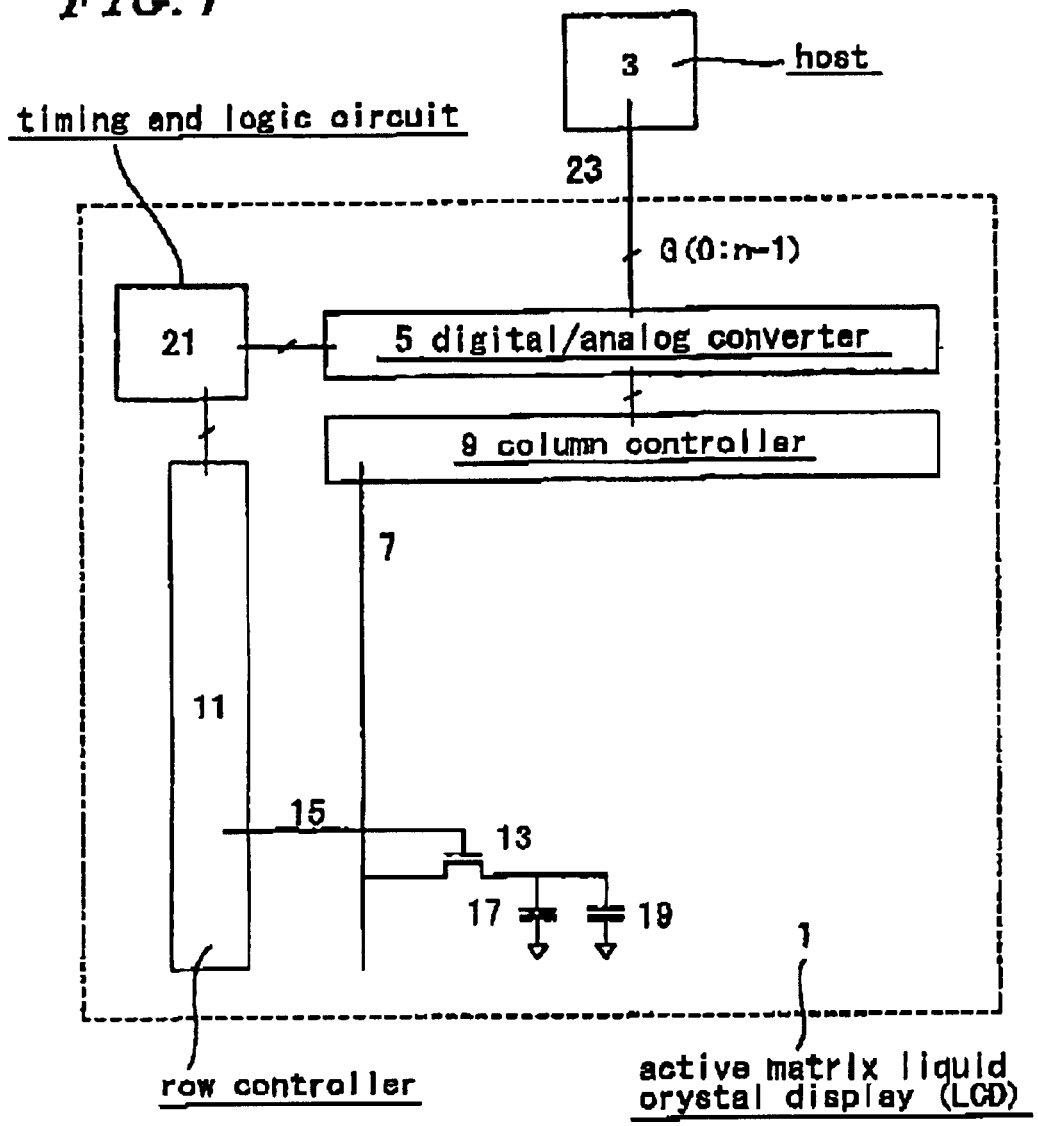
FIG. 1 is a block schematic diagram of a known type of active matrix liquid crystal display.
Figure 2:
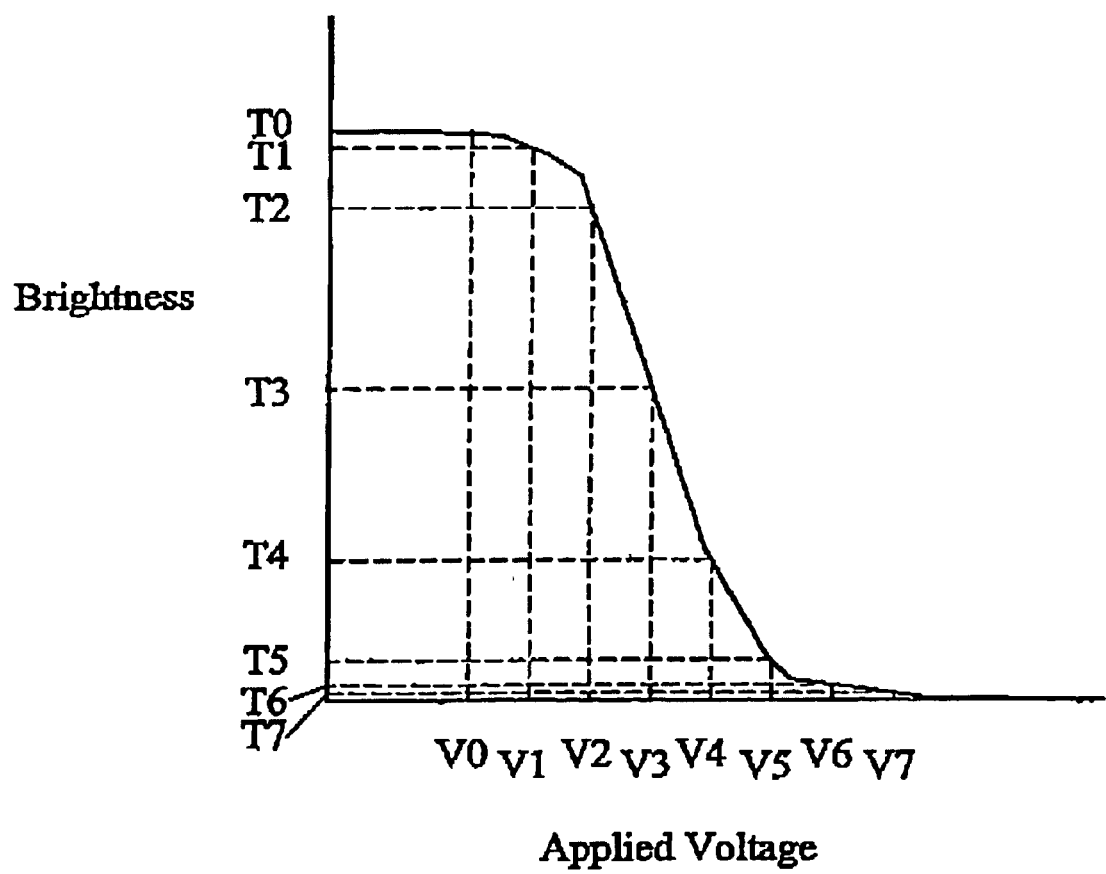
FIG. 2 is a graph of brightness against applied voltage for a liquid crystal pixel.
Figure 5:
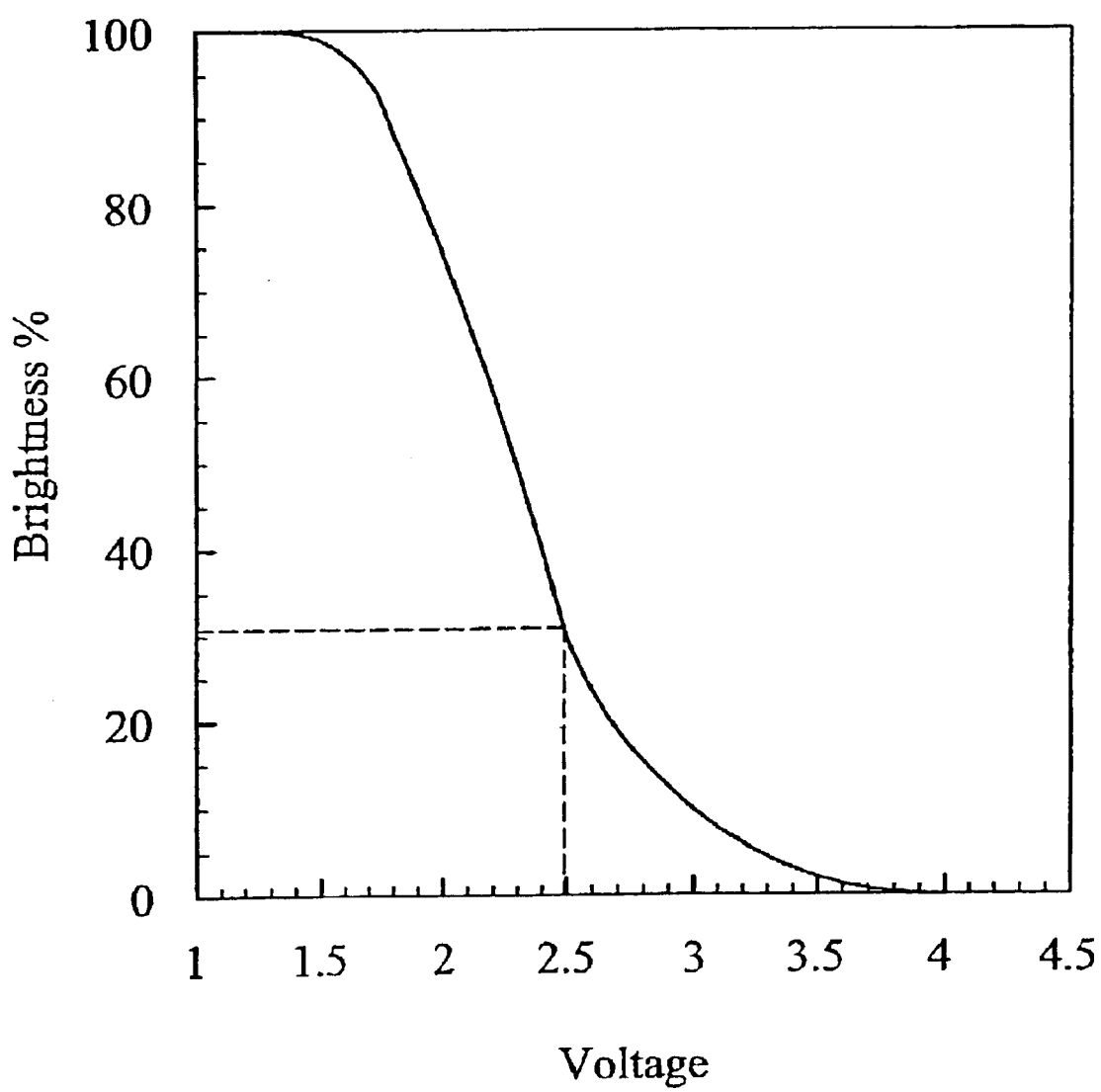
FIG. 5 is another graph of brightness against voltage for a liquid crystal pixel.

A conversion arrangement of the type shown in FIG. 4 may be used to provide gamma correction for a liquid crystal display, for example of the type shown in FIG. 1. this arrangement may be used as the DAC5 which, together with the controllers 9 and 11 and the circuit 21, may be integrated directed on the display panel itself (for example in the case of polysilicon or continuous grain silicon LCDs) or may be formed as one or more separate "modules" external to the panel or bonded thereto (for example in the case of amorphous silicon LCDs). FIG. 5 illustrates an experimentally determined liquid crystal brightness/voltage curve which may be corrected using this arrangement. In this context, it is not necessary for the correction to result in exactly evenly spaced brightness levels for evenly spaced inputs but it is sufficient for the brightness levels to be made more evenly spaced than would be achieved by applying evenly spaced voltages to a liquid crystal pixel. The curve shown in FIG. 5 is such that 0% brightness is achieved for an applied voltage of 4.1 volts and 100% brightness is achieved for an applied voltage of 1.2 volts.

Figure 6:
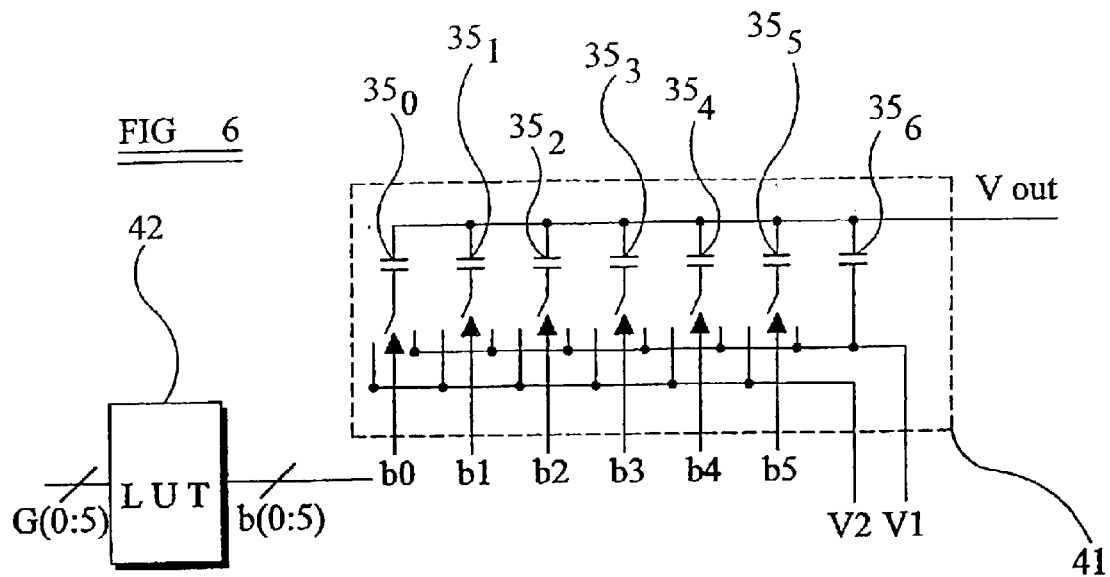
FIG. 6 illustrates a converter of the type shown in FIG. 3 together with a look-up table.

A typical six bit LCD is capable of displaying 26 or 64 distinct grey levels. For an ideal six bit LCD, the brightness increment between each ideal grey level would have the fixed value 100/63 or approximately 1.59%. Thus, an ideal six bit LCD would be capable of displaying 64 grey levels of approximately 0%, 1.59%, 3.17%, . . . , 98.41%, and 100% brightness. The ideal grey levels are numbered from 0 to 63 (=111111 in binary), i.e. 0% brightness equals ideal grey level 0, 1.59% brightness=ideal grey level 1, . . . , 100% brightness=ideal grey level 63. Table III lists the 64 ideal grey levels and the associated ideal brightnesses. Exact reproduction of these theoretically ideal grey levels (i.e. perfect gamma correction) cannot generally be expected from any practical system. However, the arrangement shown in FIG. 6 is capable of a high degree of gamma correction. The liquid crystal voltage corresponding to each of the ideal grey levels in table III can be determined by examination of the curve in FIG. 5. For example, as illustrated, 31.75% corresponding to ideal grey level 20 corresponds to a liquid crystal voltage of approximately 2.48 volts.

TABLE III

| Grey Level | Brightness % |
|---|---|
| 0 | 0.000 |
| 1 | 1.587 |
| 10 | 3.175 |
| 11 | 4.762 |
| 100 | 6.349 |
| 101 | 7.937 |
| 110 | 9.524 |
| 111 | 11.111 |
| 1000 | 12.698 |
| 1001 | 14.286 |
| 1010 | 15.873 |
| 1011 | 17.460 |
| 1100 | 19.048 |
| 1101 | 20.635 |
| 1110 | 22.222 |
| 1111 | 23.810 |
| 10000 | 25.397 |
| 10001 | 26.984 |
| 10010 | 28.571 |
| 10011 | 30.159 |
| 10100 | 31.746 |
| 10101 | 33.333 |
| 10110 | 34.921 |
| 10111 | 36.508 |
| 11000 | 38.095 |
| 11001 | 39.683 |
| 11010 | 41.270 |
| 11011 | 42.857 |
| 11100 | 44.444 |
| 11101 | 46.032 |
| 11110 | 47.619 |
| 101000 | 63.492 |
| 101001 | 65.079 |
| 101010 | 66.667 |
| 101011 | 68.254 |
| 101100 | 69.841 |
| 101101 | 71.429 |
| 101110 | 73.016 |
| 101111 | 74.603 |
| 110000 | 76.190 |
| 110001 | 77.778 |
| 110010 | 79.365 |
| 110011 | 80.952 |
| 110100 | 82.540 |
| 110101 | 84.127 |
| 110110 | 85.714 |
| 110111 | 87.302 |

TABLE III-continued

| Grey Level | Brightness % |
|---|---|
| 111000 | 88.889 |
| 111001 | 90.476 |
| 111010 | 92.063 |
| 111011 | 93.651 |
| 111100 | 95.238 |
| 111101 | 96.825 |
| 111110 | 98.413 |
| 111111 | 100.000 |

FIG. 6 illustrates an arrangement of the type shown in FIG. 4 for providing gamma correction for such an LCD. In this example, the six bit input word G(0:5) is converted by the mapping in the look-up table 42 to the six bit word b (0:5) which is supplied to the converter 41. The terminating capacitor 36 has the capacitance 58.13 pF and the capacitors $35_0, \ldots, 35_5$ have the values $C_0=1$ pF, $C_1=17.83$ pF, $C_2=27.26$ pF, $C_3=32.80$ pF, $C_4=36.05$ pF, and $C_5=39.47$ pF. The low reference voltage $V_{low}$ is 1.2 volts and the high reference voltage $V_{ref}$ is 4.1 volts. Table IV shows the input grey level requests G(0:5), the output words b(0:5) of the table 42 supplied to the converter 41, the resulting output voltages from the converter 41 and the corresponding brigthnesses obtained from the curve in FIG. 5.

TABLE IV

| G(0:5) | b(0:5) | Vout | Brightness % |
|---|---|---|---|
| 0 | 111111 | 3.307 | 3.6499 |
| 1 | 111110 | 3.2932 | 3.8192 |
| 10 | 111101 | 3.0636 | 7.5952 |
| 11 | 111100 | 3.0499 | 7.8713 |
| 100 | 111011 | 2.9349 | 10.7545 |
| 101 | 111010 | 2.9213 | 11.0961 |
| 110 | 110111 | 2.8593 | 13.1289 |
| 111 | 110110 | 2.8456 | 13.6071 |
| 1000 | 101111 | 2.815 | 14.7083 |
| 1001 | 101110 | 2.8013 | 15.219 |
| 1010 | 11111 | 2.7683 | 16.5198 |
| 1011 | 11110 | 2.7546 | 17.0853 |
| 1100 | 111001 | 2.6916 | 19.7687 |
| 1101 | 111000 | 2.678 | 20.4007 |
| 1110 | 110101 | 2.616 | 23.5846 |
| 1111 | 110100 | 2.6024 | 24.335 |
| 10000 | 101101 | 2.5717 | 26.0662 |
| 10001 | 101100 | 2.5581 | 26.8272 |
| 10010 | 11101 | 2.525 | 28.8998 |
| 10011 | 11100 | 2.5113 | 29.7679 |
| 10100 | 110011 | 2.4874 | 31.2518 |
| 10101 | 110010 | 2.4737 | 32.0843 |
| 10110 | 101011 | 2.4431 | 34.0113 |
| 10111 | 101010 | 2.4294 | 34.9332 |
| 11000 | 11011 | 2.3963 | 37.1922 |
| 11001 | 11010 | 2.3827 | 38.1954 |
| 11010 | 100111 | 2.3674 | 39.2735 |
| 11011 | 100110 | 2.3538 | 40.3116 |
| 11100 | 10111 | 2.3207 | 42.9994 |
| 11101 | 10110 | 2.3071 | 44.0669 |
| 11110 | 1111 | 2.2764 | 46.4595 |
| 101011 | 1100 | 2.0195 | 68.3107 |
| 101100 | 100011 | 1.9955 | 70.2306 |
| 101101 | 100010 | 1.9819 | 71.3234 |
| 101110 | 10011 | 1.9488 | 73.9637 |
| 101111 | 10010 | 1.9351 | 74.952 |
| 110000 | 1011 | 1.9045 | 77.1771 |
| 110001 | 1010 | 1.8908 | 78.2234 |
| 110010 | 111 | 1.8288 | 82.5842 |
| 110011 | 110 | 1.8152 | 83.5271 |
| 110100 | 100001 | 1.7522 | 87.3777 |
| 110101 | 100000 | 1.7386 | 88.2615 |
| 110110 | 10001 | 1.7055 | 89.9576 |
| 110111 | 10000 | 1.6919 | 90.5826 |

TABLE IV-continued

| G(0:5) | b(0:5) | Vout | Brightness % |
|---|---|---|---|
| 111000 | 1001 | 1.6612 | 92.005 |
| 111001 | 1000 | 1.6476 | 92.8701 |
| 111010 | 101 | 1.5856 | 95.0588 |
| 111011 | 100 | 1.5719 | 95.4922 |
| 111100 | 11 | 1.4569 | 98.0993 |
| 111101 | 10 | 1.4433 | 98.3256 |
| 111110 | 1 | 1.2136 | 99.909 |
| 111111 | 0 | 1.2 | 100 |

By comparing tables III and IV, it is clear that the embodiment illustrated in FIG. 6 provides a high degree of gamma correction in that the brightness values produced by the embodiment of FIG. 6 are approximately equally spaced and correspond reasonably closely to the ideal brightness levels. For example, grey level 20 (=10010 in binary) has a theoretical brightness of 28.571% whereas the embodiment of FIG. 6 produces a brightness of approximately 28.9%.

The reference voltages and capacitance values are chosen so as to provide good gamma correction in respect of the curve illustrated in FIG. 5. In principal, gamma correction can be provided for any curve by the appropriate choice of values of the capacitances and reference voltages. Also, it is the ratio between capacitances which is important whereas the actual values can be chosen arbitrarily and in accordance with other requirements provided the ratios are as required for the particular gamma correction.

When embodying the converter shown in FIG. 6 in an integrated circuit, the capacitance of a capacitor is substantially proportional to its area within the integrated circuit. In order to form capacitors with accurately prescribed ratios, it may be advantageous for all of the capacitance values to be integer multiples of the smallest capacitance. This maybe expressed as $C_s = A_s \cdot C_o$ for each integer s greater than o and less than n, where $A_s$ is an integer greater than o. Also, smaller capacitance values are preferred in order to reduce power consumption. Thus, for the specific example described with reference to FIG. 6, the smallest capacitance $C_0$ may have the value 0.1 pF, the capacitances $C_1, \ldots, C_5$ may have the values 1.6 pF, 2.5 pF, 3 pF, 3.3 pF, 3.6 pF and the terminating capacitor 36 may have the capacitance 5.3 pF. Such an arrangement provides acceptable gamma correction and the brightness variations resulting from the differences between the "integer multiple" capacitances and the "ideal" capacitances are substantially imperceptible to a viewer of the display.

Figure 7:
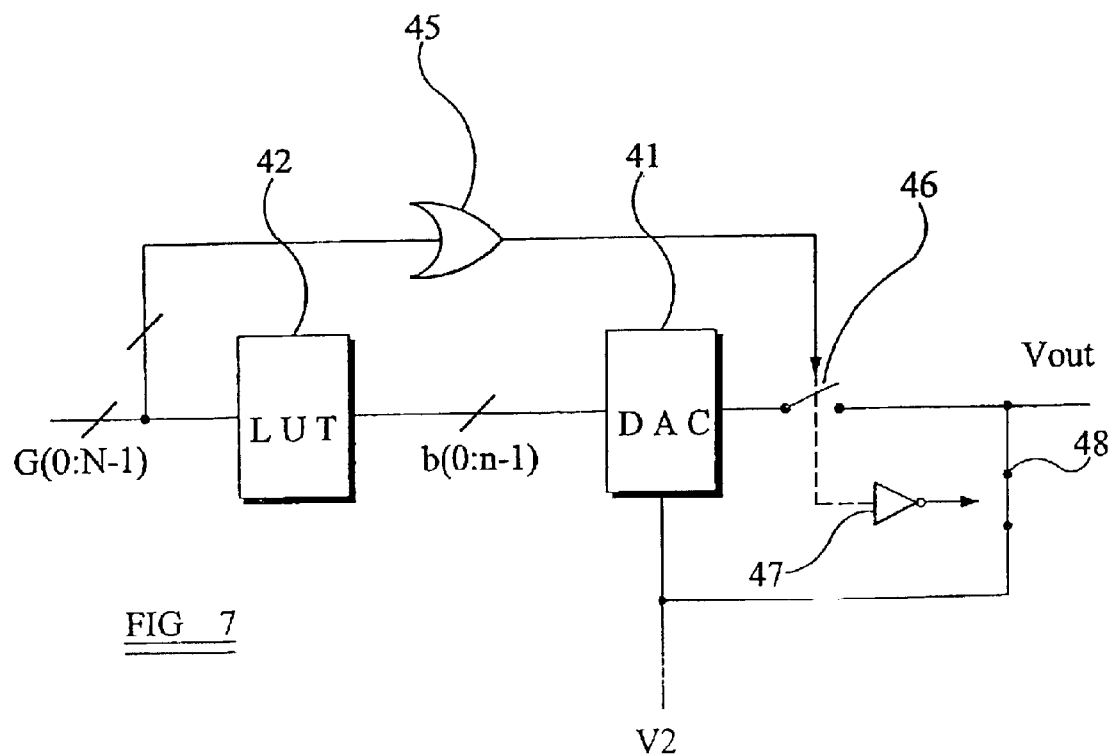
FIG. 7 illustrates a modified arrangement of the type shown in FIG. 4.

In some embodiments, it is possible to omit the terminating capacitor 36. For example, FIG. 7 illustrates an embodiment in which the terminating capacitor may be omitted from the converter 41. In the previously described embodiment where the terminating capacitor is present, the maximum output voltage is constrained to be less than the higher reference voltage V2. For example, in the previously described specific example, the maximum output voltage is 3.307 volts, which is less than the higher reference voltage of 4.1 volts.

It may be desirable to achieve an output voltage of 4.1 volts in order for the best dark state of the display to be achieved. The arrangement of FIG. 7 permits this.

The arrangement of FIG. 7 further differs from that of FIG. 6 in that the input word G(0:n−1) is supplied both to the address inputs of the memory 42 containing the look-up table and to a combinatorial logic circuit 45 comprising an arrangement of gates (illustrated as an OR gate in FIG. 7) which produces an active output when the input word G is 0. The output signal controls an electronic switch 46 and, via an inverter 47, an electronic switch 48. The electronic switch 46 connects the output of the arrangement to the output of the converter 41 when the output signal of the logic circuit 45 is inactive and disconnects the output from the converter when this signal is active. Conversely, the electronic switch 48 connects the output to the second reference voltage V2 when the output signal of the circuit 45 is active and disconnects it from the reference voltage when the output signal of the circuit 45 is inactive. For all input words having values other than 0, the arrangement shown in FIG. 7 operates as described for the previous embodiments. When the input word is 0, the output is disconnected from the converter 41 and is connected to the second reference voltage so that, in the specific example described with reference to FIG. 6, the output voltage for the "black" state is 4.1 volts.

If desired, it is possible to arrange the combinatorial logic circuit 45 to produce further active outputs for further predetermined values of the input word and for the further active outputs to cause the output of the arrangement to be connected to other predetermined voltages. For example, the maximum value of the input word may be decoded to connect the output to the lower reference voltage.

Figure 8:
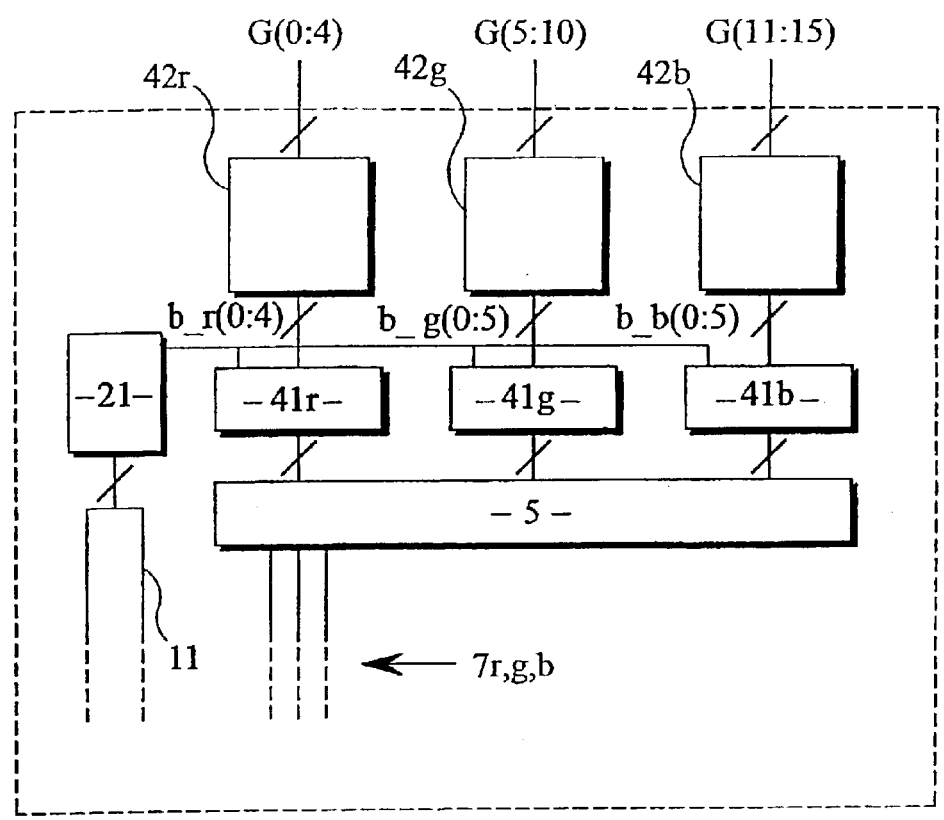
FIG. 8 is a block schematic diagram of an RGB liquid crystal display.

FIG. 8 illustrates a colour liquid crystal display of the same general type as shown in FIG. 1 but arranged to display red, green and blue image data. The image data are received as a 16 bit word G(0:15) with the first 5 bits G(0:4) representing red image data, the next 6 bits G(5:10) representing green image data, and the last 5 bits G(11:15) representing blue image data. Three converter arrangements of the type described hereinbefore are provided for converting the respective colour component image data to corresponding gamma corrected voltages for driving the respective pixels via column electrodes 7r, 7g and 7b. The red image data are supplied to a look-up table 42r, whose output supplies a word b_r(0:4) to a converter 41r for driving the red pixels. Similarly, look-up tables 42g and 42b for the green and blue colour components supply image data b_g (0:5) and b_b(0:4) to converters 41g and 41b for driving the green and blue pixels, respectively. The converters 41r and 41b are non-linear switched capacitor 5 bit converters whereas the converter 41g is a non-linear switched capacitor 6 bit converter.

In practice, the brightness/voltage curves for liquid crystal pixels may differ slightly for red, green and blue light. The look-up tables and the conversion functions of the converters shown in FIG. 8 may therefore differ for each colour so as to provide improved gamma correction for the three colour components. However, if the required gamma corrections are sufficiently similar for two or three of the colour components, the arrangements for the components may be the same and the three separate conversion arrangements shown in FIG. 8 may be replaced by two arrangements or by one arrangement with the appropriate multiplexing.

Figure 9:
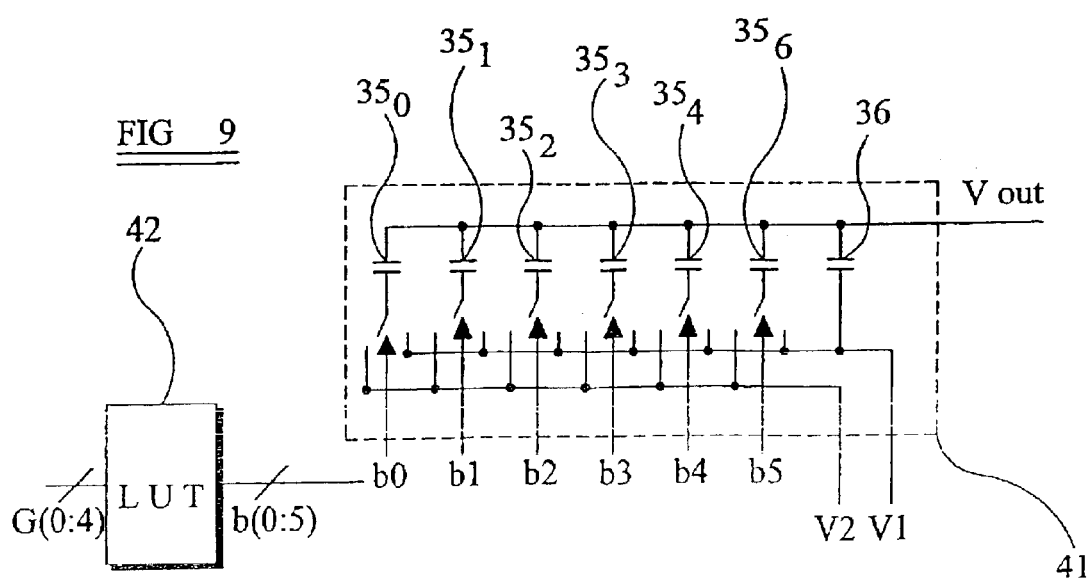
FIG. 9 illustrates another arrangement of a type similar to that shown in FIG. 6.

FIG. 9 illustrates an arrangement which differs from that shown in FIG. 6 in that a 5 bit input word G(0:4) is supplied to the look-up table 42, which produces a six bit output word b(0:5) for controlling the switches of the six bit converter 41. More generally, such an arrangement may be arranged to receive an m bit word at the address inputs of the look-up table 42 and to provide a n bit word for driving an n bit word converter 41, where n≧m. such an arrangement permits improved gamma correction to be obtained in many applications. In particular, in the example shown in FIG. 9, only 32 different grey levels may be requested but these are selected from 64 possible grey levels and, in particular 64 possible converter output voltages.

In one example of the operation of such an arrangement, the 5 bit input word comprises 11111 and this is padded by adding 0 to form a word 111110 which is applied to the address inputs of the look-up table 42. This is then converted by the look-up table 42 to 000001 in accordance with table IV before being supplied to the converter 41 for conversion to the analog voltage appropriate to the desired grey level.

In some embodiments, the digital/analog converter is inherently monotonic and it is not necessary to provide a look-up table ahead of the converter in order to provide gamma correction. For example, in the case of a 3 bit converter whose capacitance ratios $C_0:C_1:C_2:C_{term}$ are 1:3:7:2, the conversion transfer function of the converter is inherently monotonic as illustrated in table V.

TABLE V

| Input word G (0:2) | Output word b (0:2) | Vout |
|---|---|---|
| 111 | 000 | 0 |
| 110 | 001 | 1/13 |
| 101 | 010 | 3/13 |
| 100 | 011 | 4/13 |
| 011 | 100 | 7/13 |
| 010 | 101 | 8/13 |
| 001 | 110 | 10/13 |
| 000 | 111 | 11/13 |

In order for the values of the input word G(0:2) to address correctly the desired grey levels, it is merely necessary for the individual bits of the input word to be inverted to form the word b(0:2) which is supplied to the converter, as illustrated in table V.

Figure 10:
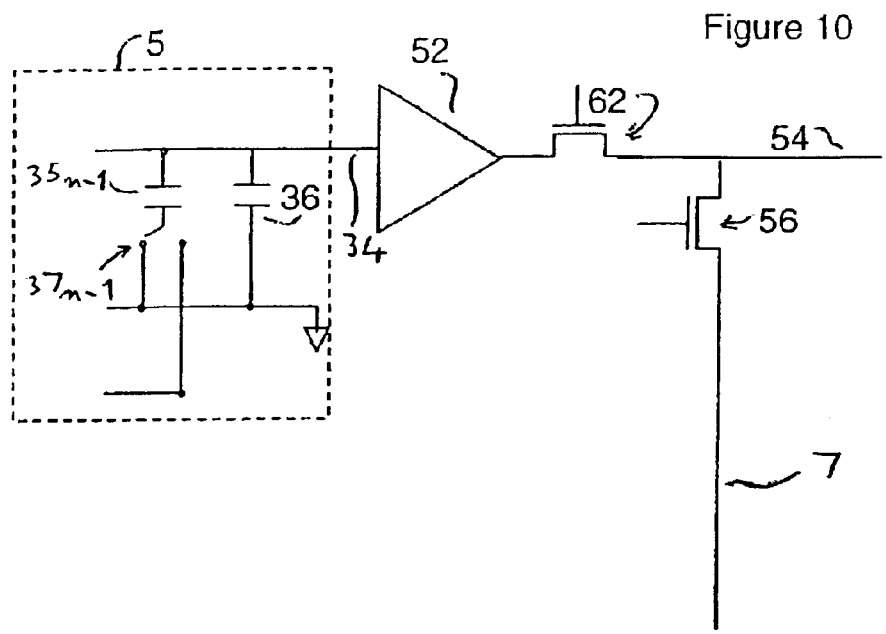
FIG. 10 is a circuit diagram of part of an active matrix display constituting an embodiment of the invention.

FIG. 10 illustrates part of the digital/analog converter 5 of the type shown in FIG. 3 together with an arrangements for supplying the voltage from the converter to the column electrode 7 of the display active matrix. The converter 5 comprises a terminating capacitor 36 and the output 34 of the converter is connected to the input of a buffer-amplifier 52. The output of the buffer-amplifier 52 is connected via an electronic switch 62 to a video line 54. The column electrodes such as 7 are similarly connected via electronic switches such as 56 to the video line 54.

In integrated circuits, capacitors are conventionally formed by, for example, over-laying two rectangles of conductive material separated by a layer of insulating material. However, as is well known, some capacitance is associated with every element, such as conductive interconnections, in an electronic circuit. Such capacitance is often referred to as "stray" or "parasitic" capacitance and is generally considered undesirable because it has the effect of reducing the speed at which digital signals can propagate along conductors. For example, the conductive column electrode 7 has capacitance. In particular, in embodiments where a uniform counter-electrode is provided on the other side of a layer of liquid crystal material, the electrode 7 and the counter-electrode form a plate capacitor. Other spatially separated conductors, such as neighbouring column electrodes, also contribute to the capacitance. Further, the controller 9 has some capacitance associated with its circuit elements.

The capacitors of the converter 5 in the embodiment illustrated in FIGS. 3 and 10 are embodied as over-laying rectangles of conductive materials separated by a layer of insulating material. The parasitic capacitance in the active matrix do not contribute to this because of the effect of the buffer-amplifier 52.

Figure 11:
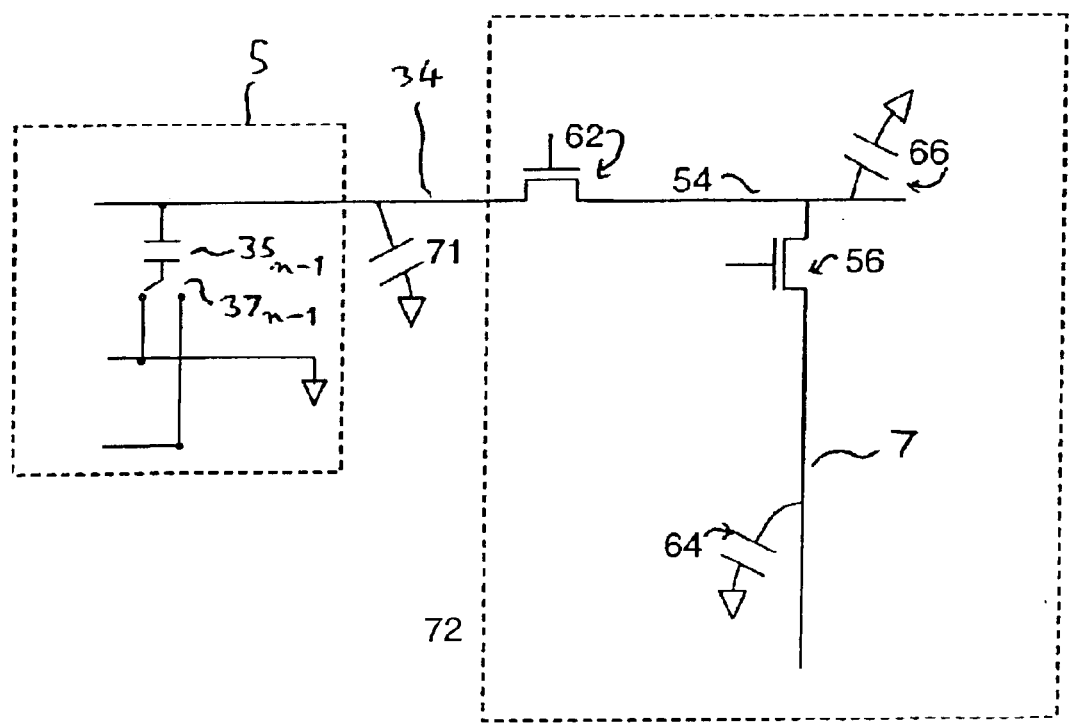
FIG. 11 is a circuit diagram of part of an active matrix display constituting another embodiment of the invention.

FIG. 11 illustrates an alternative arrangement, in which the role of the terminating capacitor 36 is performed by parasitic capacitance. In this embodiment, the output 34 of the converter 5 is connected directly to the active matrix without any buffering so that the buffer-amplifier 52 shown in FIG. 10 is omitted. FIG. 11 illustrates the parasitic capacitance of the video line 54 as a motional capacitor 66 and the parasitic capacitance of the column electrode 7 as the notional capacitor 64. The total effective capacitance at the output 34 of the converter 5 is illustrated by the notional capacitor 71. This capacitance therefore performs the function of the terminating capacitor for the converter 5 so that no explicit terminating capacitor, such as 36, is necessary. By calculating or measuring the capacitance 71, the buffer-amplifier 52 and the capacitor 36 can be omitted and the converter 5 can be designed to operate correctly. Some saving in space on the substrate is achieved but the omission of a buffer-amplifier such as 52 for the or each digital/analog converter 5 provides a substantial saving in power consumption of a display.

What is claimed is:

1. A switched capacitor digital/analog converter comprising an input for an n bit digital word, where n is an integer greater than two, and n capacitors having values $C_0, \ldots, C_{n-1}$ such that $C_x < C_{x+1}$ for each integer x greater than −1 and less than (n−1) and such that $C_{y+1}$ is different from $2 \cdot C_y$ for at least one integer y greater than −1 and less than (n−1), said capacitors having first electrodes which are connected together, each of said capacitors having a second electrode which is connectable to one of first and second reference voltages in accordance with a value of a respective bit of said n bit word.

2. A converter as claimed in claim 1, in which $C_{p+1}/C_p$ is different from $C_{q+1}/C_q$ for at least one integer p greater than −1 and less that (n−1) and at least one integer q different from p and greater than −1 and less than (n−1).

3. A converter as claimed in claim 1, comprising a terminating capacitor having a first electrode connected to said first electrodes of said n capacitors and a second electrode for receiving said first reference voltage.

4. A converter as claimed in claim 1, comprising a terminating capacitor constituted by parasitic capacitance.

5. A converter as claimed in claim 1, comprising means for selectively discharging all of said capacitors.

6. A converter as claimed in claim 1, in which said second electrode of each of said n capacitors of value $C_r$ is connectable to one of said first and second reference voltages in accordance with a value of an rth significant bit of said n bit word for each integer r greater than −1 and less than n.

7. A converter as claimed in claim 1, in which $C_s = A_s \cdot C_0$ for each integer s greater than 0 and less than n, where each $A_s$ is an integer greater than 0.

8. A converter as claimed in claim 1, comprising an output arranged to be switched to at least one further reference voltage in response to at least one predetermined digital word for conversion.

9. A converter as claimed in claim 8, in which said at least one further reference voltage comprises one of said first and second reference voltages.

10. A converter as claimed in claim 1, comprising a circuit for receiving an m bit word for conversion and for supplying to said input said n bit word derived from said m bit word in accordance with a predetermined function, where m is an integer greater than one.

11. A converter as claimed in claim 10, in which m=n.

12. A converter as claimed in claim 10, in which m is less than n.

13. A converter as claimed in claim 10, in which, during a conversion phase, a voltage at said first electrodes is a non-monotonic function of said n bit digital word and said predetermined function is such that said voltage at said first electrodes is a monotonic function of said m bit word.

14. A converter as claimed in claim 10, in which said circuit comprises a combinational logic circuit.

15. A converter as claimed in claim 10, in which said circuit comprises a memory containing a look-up table.

16. A display driver including at least one switched capacitor digital/analog converter comprising an input for an n bit digital word, where n is an integer greater than two, and n capacitors having values $C_0, \ldots, C_{n-1}$ such that $C_x < C_{x+1}$ for each integer x greater than −1 and less than (n−1) and such that $C_{y+1}$ is different from $2 \cdot C_y$ for at least one integer y greater than −1 and less than (n−1), said capacitors having first electrodes which are connected together, each of said capacitors having a second electrode which is connectable to one of first and second reference voltages in accordance with a value of a respective bit of said n bit word.

17. A display comprising a display driver including at least one switched capacitor digital/analog converter comprising an input for an n bit digital word, where n is an integer greater than two, and n capacitors having values $C_0, \ldots, C_{n-1}$ such that $C_x < C_{x+1}$ for each integer x greater than −1 and less than (n−1) and such that $C_{y+1}$ is different from $2 \cdot C_y$ for at least one integer y greater than −1 and less than (n−1), said capacitors having first electrodes which are connected together, each of said capacitors having a second electrode which is connectable to one of first and second reference voltages in accordance with a value of a respective bit of said n bit word.

18. A display as claimed in claim 17, in which said at least one converter is arranged to provide gamma correction.

19. A display as claimed in claim 17, in which said display comprises a liquid crystal device.

20. A display as claimed in claim 17, comprising a pixel matrix and in which said at least one converter comprises a terminating capacitor constituted by parasitic capacitance, said first electrodes of said n capacitors of said at least one converter being connected directly without buffering to said pixel matrix.

* * * * *